United States Patent
Tamura et al.

(10) Patent No.: US 6,783,296 B2
(45) Date of Patent: Aug. 31, 2004

(54) SCREW-ON STRUCTURE

(75) Inventors: Nobuhiro Tamura, Tokyo (JP); Kazuhiko Asahina, Tokyo (JP)

(73) Assignee: NEC Corporation, Tokyo (JP)

( * ) Notice: Subject to any disclaimer, the term of this patent is extended or adjusted under 35 U.S.C. 154(b) by 36 days.

(21) Appl. No.: 10/015,585

(22) Filed: Dec. 17, 2001

(65) Prior Publication Data

US 2002/0076264 A1 Jun. 20, 2002

(30) Foreign Application Priority Data

Dec. 15, 2000 (JP) ........................................ 2000-381355

(51) Int. Cl.⁷ ................................................ F16B 1/08
(52) U.S. Cl. ........................................... 403/12; 403/11
(58) Field of Search ............................. 403/11–13, 118, 403/338, 339, 348, 349; 411/352, 353, 533, 970, 999; 455/90

(56) References Cited

U.S. PATENT DOCUMENTS

| | | | |
|---|---|---|---|
| 3,137,336 A | 6/1964 | Wing | 411/135 |
| 4,434,917 A | 3/1984 | Saito et al. | 222/383 |
| 4,721,325 A | 1/1988 | Mackovjak et al. | 280/668 |
| 5,054,953 A | 10/1991 | Mattiolo | 403/406.1 |
| 5,426,831 A * | 6/1995 | Leonelli, Jr. | 24/459 |
| 5,577,860 A | 11/1996 | Plank | 403/403 |
| RE36,164 E | 3/1999 | Johnson et al. | 411/353 |
| 6,036,198 A | 3/2000 | Kramer | 279/133 |
| 6,089,723 A * | 7/2000 | Ogasawara et al. | 359/872 |
| 6,142,525 A | 11/2000 | Boelstler et al. | 280/808 |

FOREIGN PATENT DOCUMENTS

JP    A 8-307498    11/1996

* cited by examiner

Primary Examiner—J. J. Swann
Assistant Examiner—Ruth C. Rodriguez
(74) Attorney, Agent, or Firm—Young & Thompson

(57) ABSTRACT

A plastic frame and a frame are provided in a screw-on structure. A through hole is formed in the plastic frame and a screw hole is provided in the frame at a position corresponding to the through hole. Furthermore, a screw is provided, the screw is inserted in the through hole to be screwed down the screw hole. The maximum inner diameter of the through hole is made larger than the outer diameter of a shaft section of the screw. Three ribs, which protrude toward the center of the through hole to contact the shaft section of the screw, are integrally formed with the plastic frame on an inner surface of the through hole. A far end shape of the ribs is formed in a shape along an outer surface of a virtual cylinder whose diameter equals the outer diameter of the shaft section of the screw and whose center axis matches the center axis of the screw.

2 Claims, 5 Drawing Sheets

SCREW-ON STRUCTURE

BACKGROUND OF THE INVENTION

1. Field of the Invention

The present invention relates to a screw-on structure including a plastic frame, particularly to a screw-on structure that fastens a frame made up of plastic such as a cellular phone.

2. Description of the Related Art

The frames of mobile equipment such as the cellular phone are made up of plastic having lightweight and superior moldability in many cases. Many of such frames consist of two partial frames and are formed by making the partial frames screwed on with each other by a screw.

Description will be made for a conventional screw-on structure with reference to FIG. 1, FIG. 2A and FIG. 2B. FIG. 1 is a cross-sectional view showing the conventional screw-on structure, FIG. 2A is a plan view showing a plastic frame of the conventional screw-on structure, and FIG. 2B is a cross-sectional view of FIG. 2A. Note that grooves of a screw and a screw hole are not shown in FIG. 1.

As shown in FIG. 1, FIG. 2A and FIG. 2B, the conventional screw-on structure includes a plastic frame 11 provided with a through hole 15, another frame 2 where a screw hole 4 is formed, and a screw 3 inserted into the through hole 15 to be screwed down the screw hole 4. For example, the plastic frame 11 is a part of the frame that composes a non-display side of the cellular phone and the frame 2 is a part of the frame that composes a display side thereof. Then, the plastic frame 11 and the frame 2 are fastened with each other and fixed by the screw 3. Accordingly, the frame of the cellular phone is formed.

Further, the shape of the through hole 15 is circular. The inner diameter of the through hole 15 is larger than the outer diameter d of a shaft section 7 of the screw 3, and a clearance is thus provided between the plastic frame 11 and the shaft section 7 of the screw 3. The clearance can absorb a slippage between positions of the through hole 15 and the screw hole 4 when screwing on the plastic frame 11 and the frame 2 by the screw. Furthermore, the clearance can absorb an inner diameter error of the through hole 15 and an outer diameter error of the shaft section 7 of the screw 3.

However, there exist problems shown below in the conventional screw-on structure. The foregoing conventional screw-on structure has a problem that the screw comes loose when external force such as vibration and impact is applied to the screw-on structure, which is fastened each other by the screw 3. This problem is conspicuous with the mobile equipment such as the cellular phone because vibration and impact are constantly applied to the equipment. For this reason, the screw must be fixed by adding a part such as a spring washer or a method such as coating adhesive agent.

However, there exists a problem of increasing a manufacturing cost of the screw-on structure when the part such as the spring washer is added and the adhesive agent is coated. There also exists a problem that an external appearance is impaired due to existence of the part such as the spring washer or coating of the adhesive agent when the screw-on structure is applied to the mobile equipment such as the cellular phone. Furthermore, there exists a problem that it is difficult to remove a once fastened screw without hurting the plastic frame when the adhesive agent is coated on the screw-on structure.

SUMMARY OF THE INVENTION

The object of the present invention is to provide a screw-on structure where the screw is prevented from coming loose without fastening the screw by adding the part such as the spring washer and coating the adhesive agent in the screw-on structure including the frame made of plastic.

The screw-on structure according to the present invention comprises: the plastic frame having the through hole; the frame where the screw hole is formed; the screw that is inserted into the through hole to be screwed down the screw hole and that fastens the plastic frame and the frame to each other; and ribs made of plastic provided on the inner surface of the through hole and protrude toward the center of the through hole to contact the shaft section of the screw.

The inventors enthusiastically performed experiments and research in order to find out a cause of occurring loosening of the screw in the foregoing conventional screw-on structure. As a result, the inventors obtained the following findings. The inner diameter of the through hole 15 of the conventional plastic frame 11 shown in FIG. 1 is larger than the outer diameter d of the shaft section 7 of the screw 3, and the clearance is provided between the plastic frame 11 and the screw 3. Accordingly, the plastic frame 11 moves relatively against the screw 3 and the frame 2 when the external force such as vibration and impact is applied to the screw-on structure. As a result, the plastic frame 11 is wasted to be thin due to abrasion between the screw 3 and the frame 2. Thus, the screw 3 cannot maintain a necessary fastening torque, and the screw 3 comes loose.

In the present invention, providing the rib, which protrudes toward the center of the through hole to contact the shaft section of the screw, on the inner surface of the through hole of the plastic frame can prevent the plastic frame from moving relatively against the screw and the frame when the external force such as vibration and impact is applied to the screw-on structure. With this configuration, the fastening torque of the screw is maintained and the screw is prevented from coming loose. Therefore, there is no need to fix the screw by adding the part such as the spring washer or by coating the adhesive agent. Furthermore, since the rib is made up of plastic, the slippage between the positions of the through hole and the screw hole can be absorbed by distortion of the rib.

In addition, the shape of the far end of the rib may be a shape along a virtual cylinder surface whose diameter substantially equals the outer diameter of the shaft section of the screw and whose center axis substantially matches the center axis of the shaft section of the screw. Accordingly, an area where the rib contacts the screw becomes larger and movement of the plastic frame to the screw and the frame can be efficiently controlled. Even if the outer diameter of the screw or the shape of the rib has an error and the outer diameter of the screw is larger than the outer diameter of the virtual cylinder, the rib can absorb the error by deforming because the rib is made up of plastic.

Moreover, three or more ribs may be provided, the shape of the ribs in a cross-section perpendicular to the center axis of the shaft section of the screw may form an arc, and the far end of each of the ribs may contact the virtual circle whose diameter substantially equals the outer diameter of the shaft section of the screw and whose center axis substantially matches the center axis of the shaft section of the screw. The rib can be easily formed with this configuration. Further, the area where the ribs contact the screw becomes smaller, which makes it easier to absorb the slippage between the positions of the through hole and the screw and the error of the outer diameter of the shaft section of the screw or the shape of the rib.

DETAILED DESCRIPTION OF THE PREFERRED EMBODIMENTS

Figure 3:
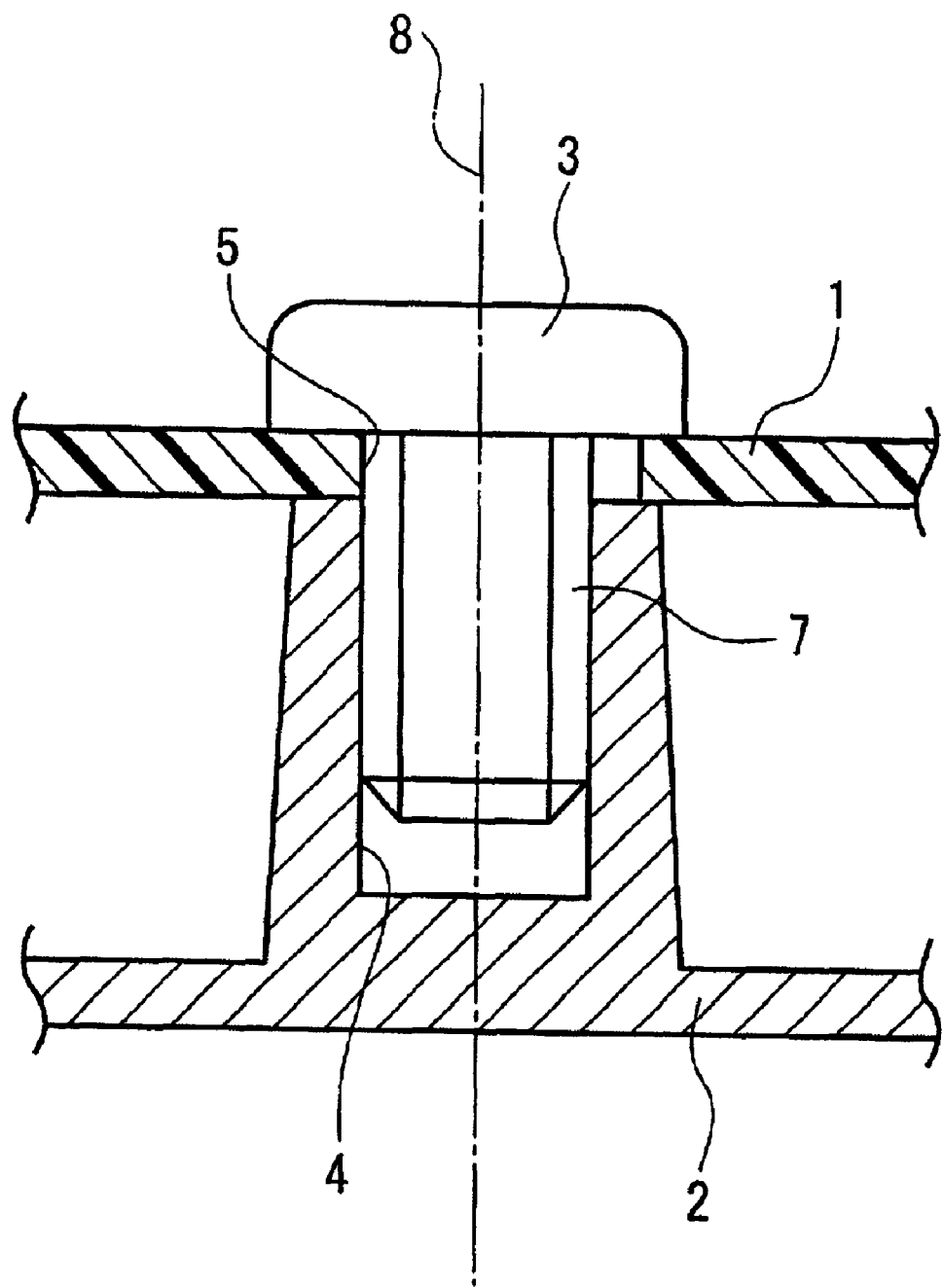
FIG. 3 is a cross-sectional view showing a screw-on structure according to a first embodiment of the present invention.
Figure 4A:
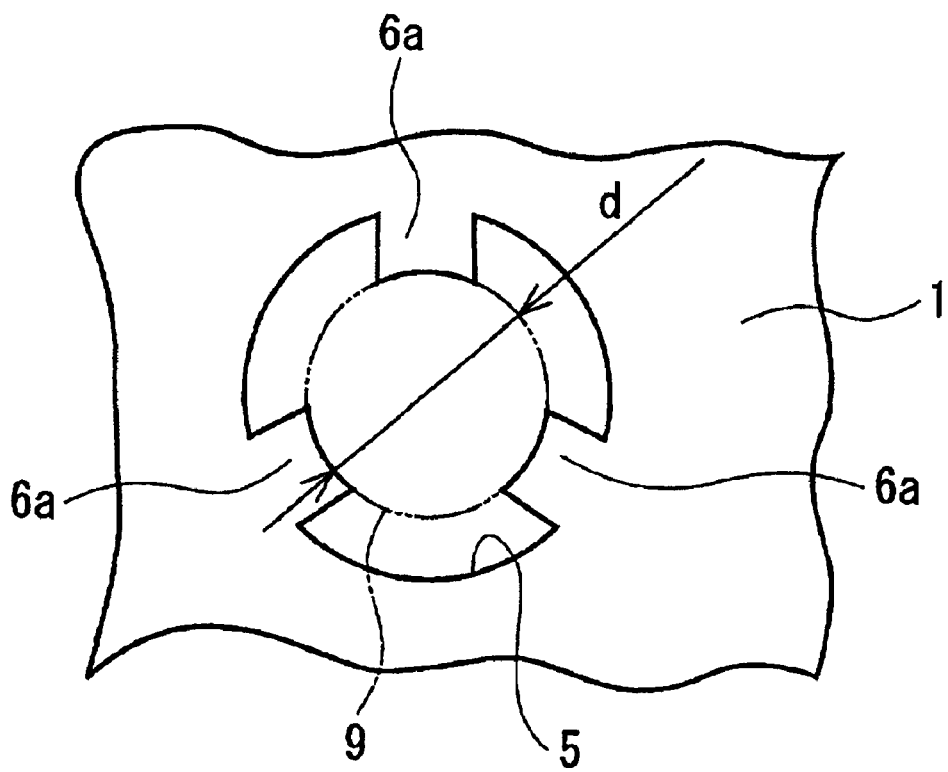
FIG. 4A is a plan view showing the plastic frame of the screw-on structure of the first embodiment.
Figure 4B:
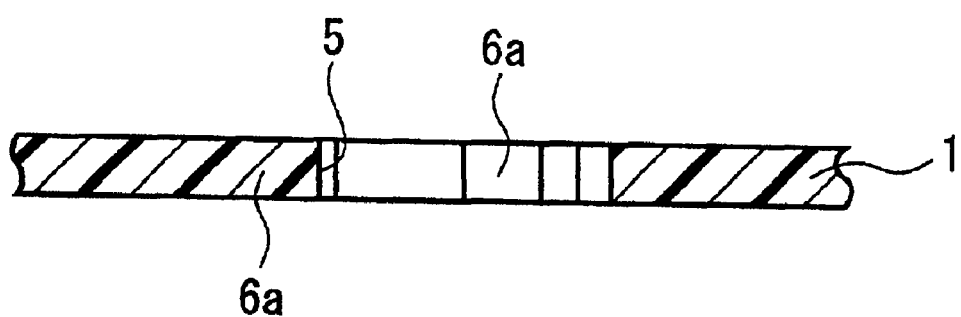
FIG. 4B is a cross-sectional view showing the plastic frame of the first embodiment.

Embodiments of the present invention will be specifically described with reference to the accompanying drawings. However, the embodiments of the invention shown below do not limit the present invention. Firstly, description will be made for the screw-on structure according to a first embodiment of the present invention referring to FIG. 3, FIG. 4A and FIG. 4B. FIG. 3 is the cross-sectional view showing the screw-on structure according to this embodiment, FIG. 4A is the plan view showing the plastic frame of the screw-on structure of this embodiment, and FIG. 4B is the cross-sectional view showing the plastic frame. Note that the grooves of the screw and the screw hole are not shown in FIG. 3.

As shown in FIG. 3, a plastic frame 1 and the frame 2 are provided in the screw-on structure of this embodiment. A through hole 5 is formed in the plastic frame 1. Further, the screw hole 4 is provided in the frame 2 at a position corresponding to the through hole 5. Moreover, the screw 3 is provided for the screw-on structure, the screw 3 is inserted into the through hole 5 to be screwed down the screw hole 4. Thus, the plastic frame 1 and the frame 2 are screwed on and fixed with each other with the screw 3.

As shown in FIG. 4A, the maximum inner diameter of the through hole 5 is larger than the outer diameter d of the shaft section 7 of the screw 3. Three ribs 6a protruding toward the center of the through hole 5 are formed on the inner surface of the through hole 5 of the plastic frame 1. The ribs 6a are arranged along a circumference of the through hole 5 in substantially the same distance. The far end of the ribs 6a is in a shape along the outer surface of a virtual cylinder 9 whose diameter equals the outer diameter of the shaft section 7 of the screw 3 and whose center axis matches a center axis 8 of the screw 3. In other words, the far end of the ribs 6a has a recess of a cylindrical shape so as to contact along the outer surface of the shaft section 7 of the screw 3. The ribs 6a are integrally formed with the plastic frame 1.

For example, the plastic frame 1 is a frame that composes the non-display side of the cellular phone, the frame 2 is a frame that composes the display side thereof, the plastic frame 1 and the frame 2 are fixed and unified by the screw 3, and the frame of the cellular phone is thus formed. The frame 2 may be made up of either plastic or metal. The screw 3 also may be made up of either plastic or metal.

In this embodiment, the three ribs 6a contact the shaft section 7 of the screw 3 when screwing on the plastic frame 1 and the frame 2 with the screw 3. Accordingly, the plastic frame 1 is prevented from moving in a direction perpendicular to the center axis 8 against the screw 3 and the frame 2, and the plastic frame 1 can be fixedly maintained against the screw 3 and the frame 2.

As described above, the ribs 6a function to control the movement of the plastic frame 1 against frame 2 and the screw 3 when vibration, impact or the like is applied to the screw-on structure from the outside. As a result, the plastic frame 1 does not waste, the fastening torque of the screw 3 is maintained, and the screw 3 is prevented from coming loose. Therefore, there is no need to fix the screw by adding the part such as the spring washer or by coating the adhesive agent.

Furthermore, even if the slippage occurs between the central positions of the through hole 5 and the screw hole 4, the slippage can be absorbed by distortion of the ribs 6a due to fastening of the screw 3 because the ribs 6a are made up of plastic. The same applies to the case where the outer diameter of the shaft section 7 of the screw 3 is slightly larger than the outer diameter of the virtual cylinder 9.

Moreover, since the ribs 6a are integrally formed with the plastic frame 1, additional molding cost is not necessary.

Note that the number of the ribs 6a is three in this embodiment, but the ribs 6a may be four or more. Sufficient effect is exerted by providing at least three ribs 6a.

Figure 1:
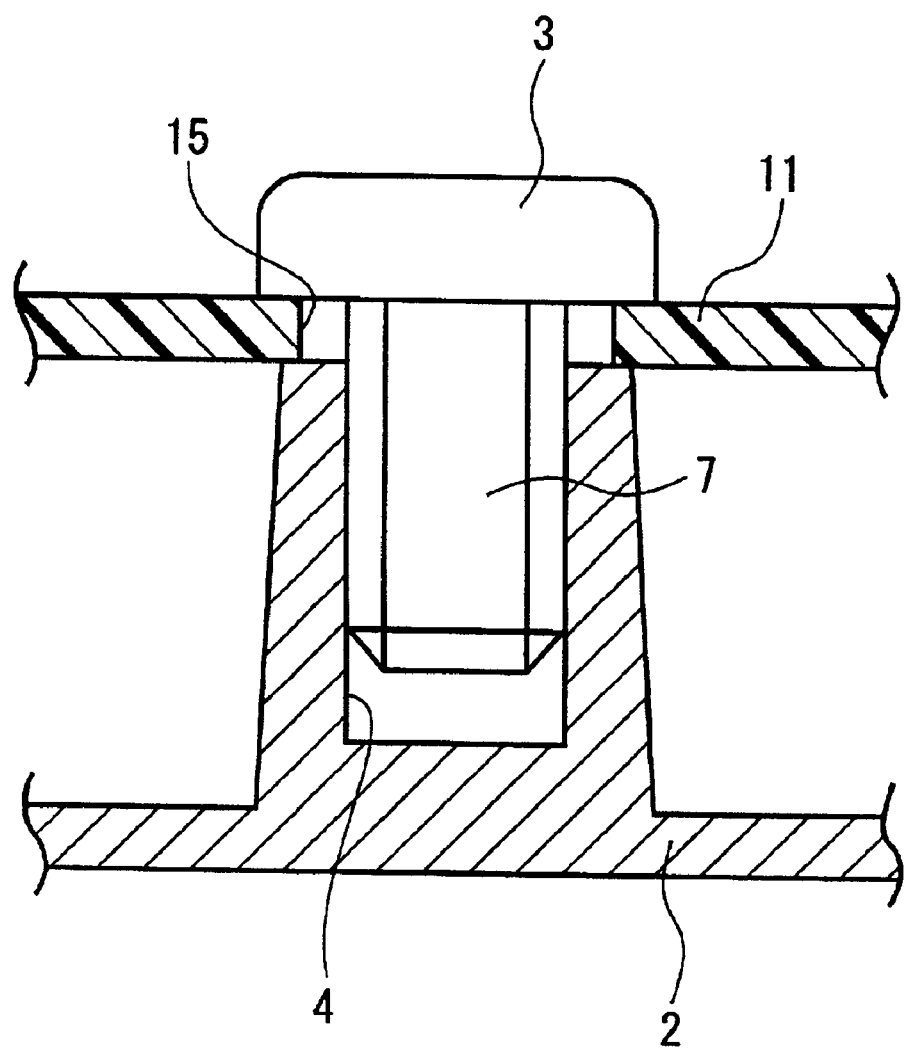
FIG. 1 is a cross-sectional view showing a conventional screw-on structure.
Figure 2A:
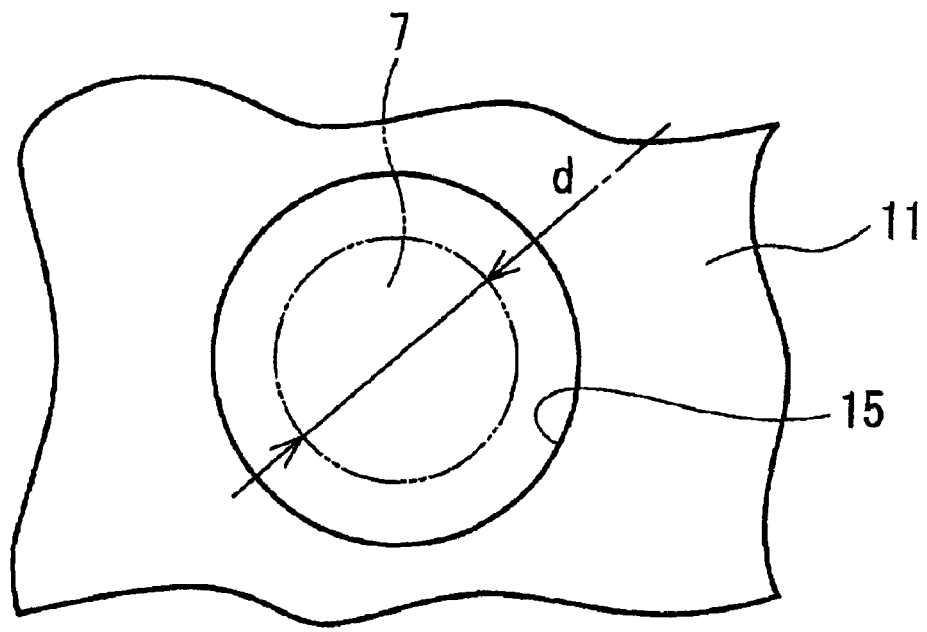
FIG. 2A is a plan view showing a plastic frame of the conventional screw-on structure.
Figure 2B:
FIG. 2B is a cross-sectional view showing the conventional plastic frame.
Figure 5A:
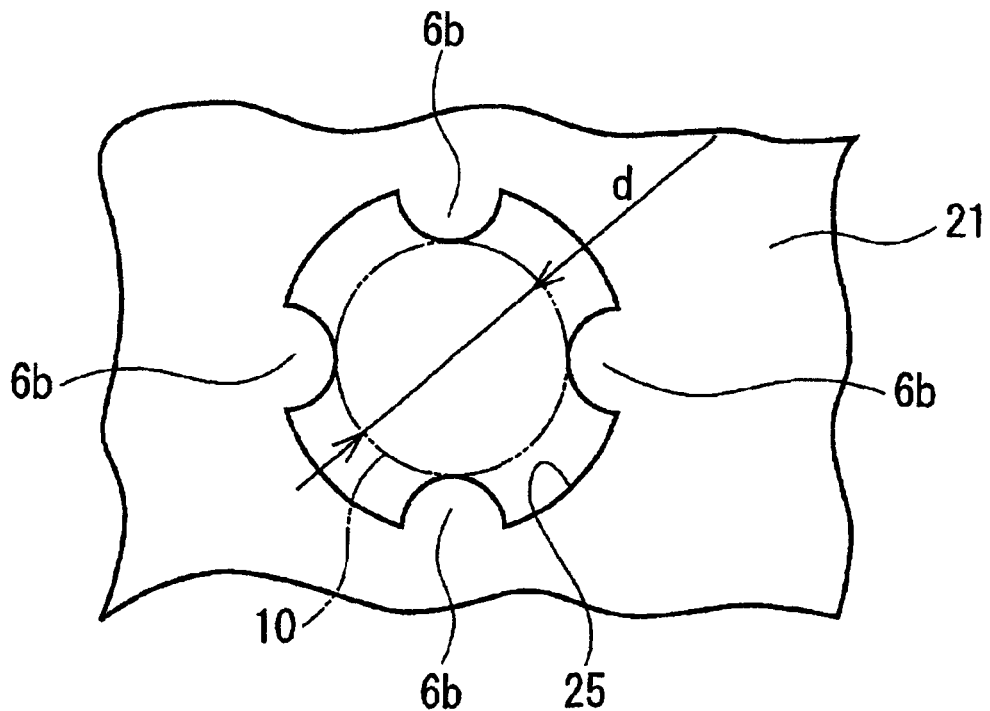
FIG. 5A is a plan view showing a plastic frame of a screw-on structure according to a second embodiment of the present invention.
Figure 5B:
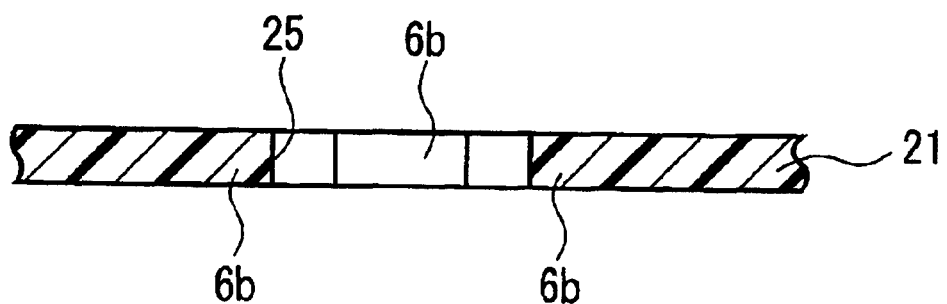
FIG. 5B is a cross-sectional view showing the plastic frame of the second embodiment.

Next, a screw-on structure according to a second embodiment of the present invention will be described referring to FIG. 5A and FIG. 5B. FIG. 5A is the plan view showing a plastic frame of the screw-on structure according to this embodiment, and FIG. 5B is the cross-sectional view thereof. In this embodiment, comparing to the first embodiment, a through hole 25 is provided in a plastic frame 21 instead of the through hole 5 (refer to FIG. 2A). The shape of the through hole 25 is different from the shape of the through hole 15 in the foregoing first embodiment.

As shown in FIG. 5A and FIG. 5B, the through hole 25 is provided in the plastic frame 21 of this embodiment. Four ribs 6b are protruded toward the center of the through hole 25 of the plastic frame 21. The ribs 6b are arranged along the circumference of the through hole 25 in the same distance. The shape of the ribs 6b at the cross-section perpendicular to the center axis 8 of the screw 3 (refer to FIG. 3) forms an arc. The far ends of the four ribs 6b contact a virtual circle 10 common to the ribs, and the diameter of the circle 10 equals the outer diameter d of the shaft section 7 of the screw 3. A configuration other than the foregoing in the screw-on structure of this embodiment is the same as the one other than the plastic frame 1 in the screw-on structure according to the first embodiment.

In this embodiment, since the ribs 6b contact the shaft section 7 of the screw 3 (refer to FIG. 3), the plastic frame 21 can be prevented from relatively moving against the screw 3 and the frame 2. Thus, the screw 3 can be prevented from coming loose due to vibration or impact from the outside.

Furthermore, in this embodiment, since the shape of the ribs 6b forms an arc, molding of the ribs is easier comparing to the first embodiment. In addition, the area where each of the ribs 6b contacts the shaft section 7 of the screw 3 is smaller comparing to the first embodiment. For this reason, the ribs 6b are easily deformed, which is greatly effective in absorbing the slippage between the central positions of the through hole 25 and the screw hole 4. In the case where the outer diameter of the shaft section 7 of the screw 3 or the diameter of the virtual circle 10 has an error and the outer diameter d of the shaft section 7 is larger than the diameter of the circle 10, the ribs 6b are also greatly effective in absorbing the error. However, the screw-on structure according to the first embodiment is more effective in fixing the plastic frame 1 to the screw 3 and the frame 2 comparing to the screw-on structure of this embodiment.

Note that the number of the ribs 6b is four in this embodiment. But, the number of the ribs may be three, or five or more. The same effect is exerted when the diameter of the circle that contacts the far ends of the ribs substantially equals the outer diameter of the shaft section 7 of the screw 3 even if the number of the ribs is changed. The effect of the present invention can be obtained by changing the distance between the ribs and the size of the ribs in accordance with the number of the ribs. In this case, it is preferable that the ribs are arranged in the same distance along the circumference of the through hole 25.

What is claimed is:

1. A screw-on structure comprising:

a plastic frame having a through hole;

a frame where a screw hole is formed;

a screw that is inserted into said through hole to be screwed down said screw hole and that fastens said plastic frame and said frame to each other; and ribs made of plastic provide on an inner surface of said through hole and protrude toward the center of said through hole to contact a shaft section of said screw, where said plastic frame and said frame form a frame of a cellular phone by screwing on with each other.

2. The screw-on structure according to claim 1, wherein said plastic frame is a part that composes a non-display side of said cellular phone, and said frame is a part that composes a display side of said cellular phone.

* * * * *